(12) United States Patent
Song

(10) Patent No.: US 11,545,914 B2
(45) Date of Patent: Jan. 3, 2023

(54) TRIBOELECTRIC GENERATING DEVICE AND MANUFACTURING METHOD THEREOF

(71) Applicant: Charles Kiseok Song, Seoul (KR)

(72) Inventor: Charles Kiseok Song, Seoul (KR)

( * ) Notice: Subject to any disclaimer, the term of this patent is extended or adjusted under 35 U.S.C. 154(b) by 240 days.

(21) Appl. No.: 16/764,903

(22) PCT Filed: Nov. 12, 2018

(86) PCT No.: PCT/KR2018/013687
§ 371 (c)(1),
(2) Date: May 18, 2020

(87) PCT Pub. No.: WO2019/103374
PCT Pub. Date: May 31, 2019

(65) Prior Publication Data
US 2020/0343829 A1    Oct. 29, 2020

(30) Foreign Application Priority Data
Nov. 22, 2017 (KR) .......................... 10-2017-0156387

(51) Int. Cl.
*H02N 1/04*  (2006.01)
(52) U.S. Cl.
CPC ..................................... *H02N 1/04* (2013.01)
(58) Field of Classification Search
CPC ...................................................... H02N 1/04
(Continued)

(56) References Cited

U.S. PATENT DOCUMENTS

2013/0307370 A1  11/2013  Jenninger et al.
2015/0061459 A1*  3/2015  Kwon .................. H02N 11/002
                                                                   310/309
(Continued)

FOREIGN PATENT DOCUMENTS

EP          3093979 A1    11/2016
JP      2011-015503 A      1/2011
(Continued)

OTHER PUBLICATIONS

Zhiming Lin et al., "Recent Progress in Triboelectric Nanogenerators as a Renewable and Sustainable Power Source." Journal of Nanomaterials 2016, 2016, pp. 1-24.
(Continued)

*Primary Examiner* — Ahmed Elnakib
(74) *Attorney, Agent, or Firm* — Sughrue Mion, PLLC

(57) ABSTRACT

Disclosed are a triboelectric power generating device and a manufacturing method thereof, which does not require a physical space to generate friction motions unlike conventional pressured induced electric power generating devices, maximizes a surface area by the junction friction portion of a friction material composite that is inexpensive and easy to mass-produce, thereby improving the durability of a generating device, and effectively producing electricity. The triboelectric power generating device includes a triboelectric generation layer (300) including a friction portion having a junction structure which is located at a central portion and made of two or more different polymers, a first electrode (100) which is located to face one surface of the triboelectric generation layer (300), and a second electrode (200) which is located to face the other surface of the triboelectric generation layer (300).

12 Claims, 12 Drawing Sheets

(58) Field of Classification Search
USPC .................................................. 310/309, 310
See application file for complete search history.

(56) References Cited

U.S. PATENT DOCUMENTS

| | | | |
|---|---|---|---|
| 2015/0194910 A1 | 7/2015 | Kim et al. | |
| 2016/0149518 A1* | 5/2016 | Wang | F03B 13/14 |
| | | | 310/310 |
| 2016/0218640 A1 | 7/2016 | Wang et al. | |
| 2016/0336505 A1 | 11/2016 | Arizumi et al. | |
| 2018/0013057 A1 | 1/2018 | Arizumi et al. | |
| 2018/0013359 A1 | 1/2018 | Park et al. | |
| 2018/0040806 A1* | 2/2018 | Gong | C08J 9/0061 |
| 2020/0343829 A1* | 10/2020 | Song | H02N 1/04 |

FOREIGN PATENT DOCUMENTS

| | | |
|---|---|---|
| JP | 2014-87149 A | 5/2014 |
| JP | 2014-207391 A | 10/2014 |
| JP | 2013-529884 A | 7/2016 |
| JP | 2016-139779 A | 8/2016 |
| KR | 10-1476742 B1 | 12/2014 |
| KR | 10-1529814 B1 | 6/2015 |
| KR | 10-1538082 B1 | 7/2015 |
| KR | 10-2016-0125276 * | 1/2016 |
| KR | 10-2016-0066938 A | 6/2016 |
| KR | 10-1645134 B1 | 8/2016 |
| KR | 10-2016-0125276 A | 10/2016 |
| KR | 10-2017-0002424 A | 1/2017 |
| KR | 10-1694003 B1 | 1/2017 |
| KR | 10-2017-0014305 A | 2/2017 |
| KR | 10-2017-0087122 A | 7/2017 |
| WO | WO 2016117285 * | 7/2016 |

OTHER PUBLICATIONS

Zhong Lin Wang et al., "Progress in triboelectric nanogenerators as a new energy technology and self-powered sensors." Energy Environ. Sci. 8, 2015, pp. 2250-2282.
Jerome F. Parmer et al., "Miscibility of polymethacrylate/poly(vinyl chloride) blends." Macromolecules 22, 1989, pp. 1078-1083.
International Search Report for PCT/KR2018/013687 dated Feb. 19, 2019.

* cited by examiner

TRIBOELECTRIC GENERATING DEVICE AND MANUFACTURING METHOD THEREOF

CROSS REFERENCE TO RELATED APPLICATIONS

This application is a National Stage of International Application No. PCT/KR2018/013687 filed Nov. 12, 2018, claiming priority based on Korean Patent Application No. 10-2017-0156387 filed Nov. 22, 2017.

TECHNICAL FIELD

The present invention relates to a triboelectric power generating device and more particularly, to a triboelectric power generating device and a manufacturing method thereof, which does not require a physical space to generate friction motions unlike conventional pressured induced electric power generating devices, maximizes a surface area by the junction friction portion of a friction material composite that is inexpensive and easy to mass-produce, thereby improving the durability of a generating device, and effectively producing electricity.

BACKGROUND ART

In the case of general pressured induced electric power generating devices, organic piezoelectric materials such as PVDF having excellent flexibility have a difficulty in producing a competitive product due to environmental hazards and high material cost. In addition, inorganic piezoelectric materials having poor flexibility have a durability problem that the material is ruptured by a continuous external pressure. In the case of triboelectric device, not only a physical space is required to generate frictional motion between friction materials, but also a structure of the device is complicated and difficult to produce in large scale, and since the degree of abrasion due to friction of a material is large, a problem of low reliability in durability occurs. In addition, existing triboelectric materials have a disadvantage that it is difficult to produce in large scale due to the difficulty in joining an electrode and a friction material and the difference in the process method of applying the friction materials to the device. Therefore, it is required to develop a triboelectric generating device that is compensated for such disadvantages.

Here, when describing the history of the development of the conventional triboelectric devices that have been conducted so far, in 2012, it was confirmed that different types of triboelectric materials were bilayered, and then electrodes face the outside, thereby producing electricity through vertical and horizontal movement between the triboelectric materials. In 2013, it was possible to produce electricity even by intersecting different types of triboelectric materials, and individual triboelectric devices were formed in a multiple layer (parallel structure) to improve power generation efficiency. In 2014, a triboelectric device having a three-dimensional structure greatly improved an amount of generated current, and it was confirmed that triboelectric can be efficiently produced by rotating a disc electrode and triboelectric material having the shape of a bicycle wheel about a central axis, it showed that it is possible to efficiently produce electricity by grating a thin-film triboelectric material by micron unit and overlapping with the electrode, and then moving horizontally, and it was confirmed that a spring was attached to the grated triboelectric material and the electrode to make it possible to move horizontally between the material and the electrode and to convert high efficiency (up to 85%) physical energy into electric energy through energy conservation through the spring.

In 2015, it showed that a structure was improved so that the friction materials could move smoothly even with little energy applied by inserting a steel rod between the friction materials for the use of a bearing, and nevertheless, triboelectric power generation efficiency was not lowered significantly. In addition, it was found that a hybrid system can supply the amount of voltage or current more stably by connecting an electromagnetic generator (AC) and a triboelectric element (AC) in series or in parallel. In addition, it was confirmed that power can be produced simultaneously from light and kinetic energy by connecting a solar cell (DC) and the triboelectric device (AC). Thereafter, researches are being conducted to improve the power generation efficiency through micro- or nano-unit patterning between the triboelectric materials, and the efficiency has been further improved by changing the material or the shape (vertical, horizontal, rotational, bent, etc.) of receiving the kinetic energy. The latest notable research result showed the possibility of use as a wind generator by fixing one side of the triboelectric device to a substrate and leaving the other side shaken in the wind.

DISCLOSURE

Technical Problem

Unlike all the triboelectric devices introduced above, in a triboelectric device to be described in the present invention, power is generated by removing a physically unnecessary structure between the triboelectric materials and using a phenomenon in which a contact between triboelectric material domains in nano units or maximum microns units is attached and detached by bending of the film. This is developed in terms of controlling the material surface shape of existing studies, and has also secured legitimacy by inheriting researches on utilizing various types of kinetic energy.

Therefore, it is an object of the present invention to provide a triboelectric generating device and a manufacturing method thereof, which does not require a physical space to generate a friction motion unlike conventional pressured induced electric power generating devices, and maximizes a surface area by the junction friction portion of a friction material composite that is inexpensive and easy to mass-produce, thereby improving the durability of a generating device and effectively producing electricity.

Technical Solution

In order to achieve the object, the present invention provides a triboelectric power generating device which includes a triboelectric generation layer 300 including a friction portion having a junction structure which is located at a central portion and made of two or more different polymers, a first electrode 100 which is located to face one surface of the triboelectric generation layer 300, and a second electrode 200 which is located to face the other surface of the triboelectric generation layer 300.

In addition, the present invention provides a manufacturing method of a triboelectric power generating device, which includes the steps of a) dissolving and dispersing, or dissolving and dispersing and then mixing, or melting and mixing two or more polymers having different dielectric properties in a solvent, respectively; b) masking a part of the surface of each of a first electrode and a second electrode having different materials; c) forming a triboelectric generation layer on the electrode by supplying a polymer solution which is mixed or unmixed in the step a) onto a unmasked exposed surface in one of the masked first and second electrodes; and d) laminating and then pressing the other electrode on which the triboelectric generation layer is not formed on the triboelectric generation layer.

Advantageous Effects

The triboelectric power generating device and the manufacturing method thereof according to the present invention does not require a physical space to generate friction motions unlike conventional pressured induced electric power generating devices, and maximizes a surface area by the junction friction portion of a friction material composite that is inexpensive and easy to mass-produce, thereby improving the durability of a generating device, and effectively producing electricity.

BEST MODE

Hereinafter, the present invention will be described in detail with reference to the accompanying drawings.

Figure 1:
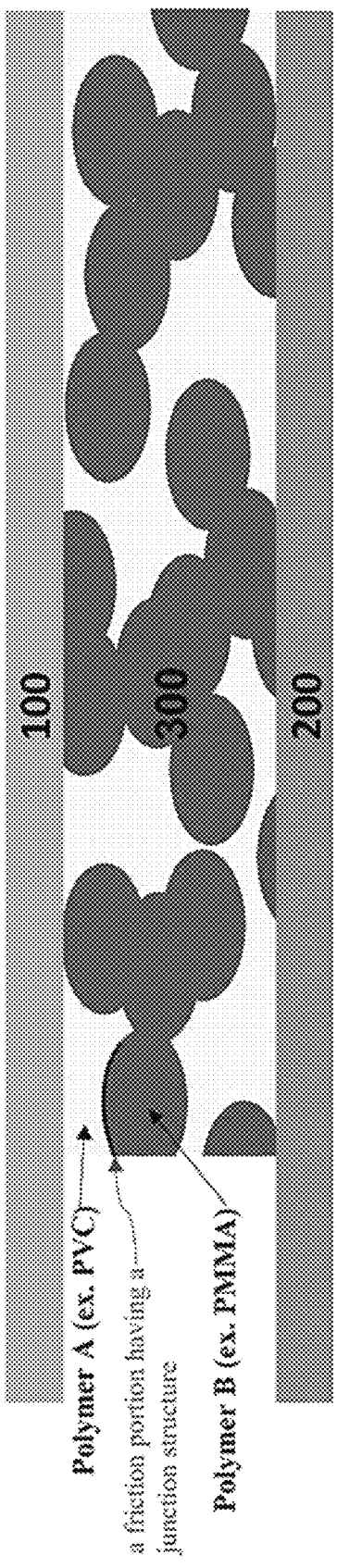
FIG. 1 is a side cross-sectional schematic view of a triboelectric power generating device according to an example of the present invention.

FIG. 1 is a side cross-sectional schematic view of a triboelectric power generating device according to an exemplary embodiment of the present invention. As illustrated in FIG. 1, a triboelectric power generating device according to the present invention includes a triboelectric generation layer 300 including a friction portion having a junction structure which is located at a central portion and made of two or more different polymers, a first electrode 100 which is located to face one surface of the triboelectric generation layer 300, and a second electrode 200 which is located to face the other surface of the triboelectric generation layer 300.

The triboelectric power generating device according to the present invention is a device capable of converting all physical kinetic energy applied from the outside into electrical energy, can be utilized for wind power generation, tidal power generation, wave power generation and the like, and may be configured by a module in which a plurality of devices are repeatedly arranged and a generator in which a plurality of the modules are repeatedly arranged in order to implement each power generation method. In addition, the triboelectric power generating device according to the present invention can detect a physical motion, texture, hardness, or applied force and thus can be utilized even as a sensor.

The triboelectric generation layer 300 is a triboelectric composite material in the form of a film including a friction portion for generating electricity, and the friction portion is formed of random junction portions in nanometers (nm) to micrometer (µm) units. The junction portion may have a bulk-heterojunction structure in which two or more different materials are not uniformly contacted, or may have a multi-junction structure, for example, a structure similar to an active layer of a bulk-heterojunction organic photovoltaics (see website). Meanwhile, the multi-junction structure is basically similar to the bulk-heterojunction structure, but may be a structure in which two or more materials are in contact with each other in a more regular shape (see website). Thus, despite the extremely short travel distances of each polarized triboelectric material, a surface area is maximized, thereby improving the reliability of the material durability and efficiently producing electricity.

Meanwhile, the triboelectric generation layer 300 has a thickness of 1 nm to 10,000 µm, preferably 100 nm to 5,000 µm, and more preferably 1 to 1,000 µm. When the thickness of the triboelectric generation layer 300 exceeds 10,000 µm, an electric field formed by the separation of charges generated at the junction portion does not affect a collector electrode, which may cause a problem that voltage and current cannot be generated. When the thickness of the triboelectric generation layer 300 is less than 1 nm, a distance between the collector electrodes is too close, and thus a short phenomenon in devices may occur due to a tunneling phenomenon.

The triboelectric generation layer (or the friction portion) is made of two or more different polymers having different dielectric properties, preferably two different polymers. The polymers may be materials that are inexpensive to manufacture and easy to mass-produce, that is, for example, polyamide, polyvinyl alcohol (PVA), polymethylmethacrylate (PMMA), polyester, polyurethane, polyvinyl butyral (PVB), polyacrylonitrile, natural rubber, polystyrene (PS), polyvinylidene chloride, polyethylene (PE), polypropylene (PP), polyimide, polyvinylchloride (PVC), and polydimethylsiloxane (PDMS), and preferably a mixture of PVC and PMMA, a mixture of PVC and PVA, a mixture of PVC and PVB, a mixture of PP and PMMA, and a mixture of PE and PMMA. When the polymers are used in two kinds of mixture (i.e., when the triboelectric generation layer includes two different polymers), the mixing (including) ratio of the polymers is a weight ratio of 0.1:99.9 to 99.9:0.1. Despite including one of the two polymers in a small amount, the effect according to the present invention occurs, and the mixing ratio of the polymers may be preferably a weight ratio of 20:80 to 80:20, more preferably a weight ratio of 40:60 to 60:40. In addition, each of the polymers preferably has a weight average molecular weight (Mw) of 10,000 to 5,000,000.

As such, when the friction portion is composed of polymers having different dielectric properties, a binding between a backbone between polymers having different dielectric properties and a functional group is broken to form radicals, which means that a charge transfer between the two materials may occur due to a material transfer formed by electrons or radicals. In addition, when ionic monomolecules are already present in the polymer or are formed due to friction, the ionic monomolecules may also migrate between heterogeneous polymers, which may cause a charge transfer. For this reason, charges between the two materials are separated to generate triboelectricity.

Meanwhile, in order to more increase the mass-productivity of the polymer materials, general-purpose solvents, such as acetone, tetrahydrofuran (THF), toluene, dichloromethane, chloroform, toluene, hexane, cyclohexane, dimethyl sulfoxide, NMP, water, and the like, may be used. That is, a composite material such as a composite film or composite particles may be formed by dissolving and then mixing the different polymers in such a solvent, melting and mixing the polymers in the solvent, or water-borne or solvent-borne dispersing and then mixing the different polymers in aqueous and non-aqueous solvents (that is, emulsion polymerization).

Accordingly, the triboelectric power generating device according to the present invention has a simple structure in which the triboelectric generation layer (or the triboelectric material composite) 300, which is easy to mass-produce, is located (inserted) between both electrodes (the first electrode 100 and the second electrode 200) and then a coating layer 400 for water-proof/moisture-proof and a coating layer 500 for supporting are coated. Thus, since the triboelectric generating device has a very simple structure as compared to existing triboelectric devices, which has a structure similar to existing commercially available pressured induced electric power generating devices, mass-productivity and reliability are high.

Next, the first electrode 100 and the second electrode 200 are made of conductive materials that allow electricity to flow by the charging phenomenon, and any conductive material that satisfies this may be applied without particular limitation. Examples of such conductive materials may include copper, aluminum, gold, silver, carbon felt, carbon paper, a composite added with carbon nanotubes (CNT), and the like, and the electrode is not particularly limited in its form such as porous foam in addition to the usual film form.

However, the first electrode 100 and the second electrode 200 may be formed of different materials, respectively. In addition, the first electrode 100 and the second electrode 200 have thicknesses of 20 nm to 5 mm, preferably 50 nm to 1 mm, and more preferably 100 nm to 100 um. When the thickness of the first electrode 100 and the second electrode 200 exceeds 5 mm, the flexibility corresponding to the wind of the device may be lowered, and when the thickness thereof is less than 20 nm, the performance of the device may be deteriorated due to an increase in resistance.

Figure 2A:
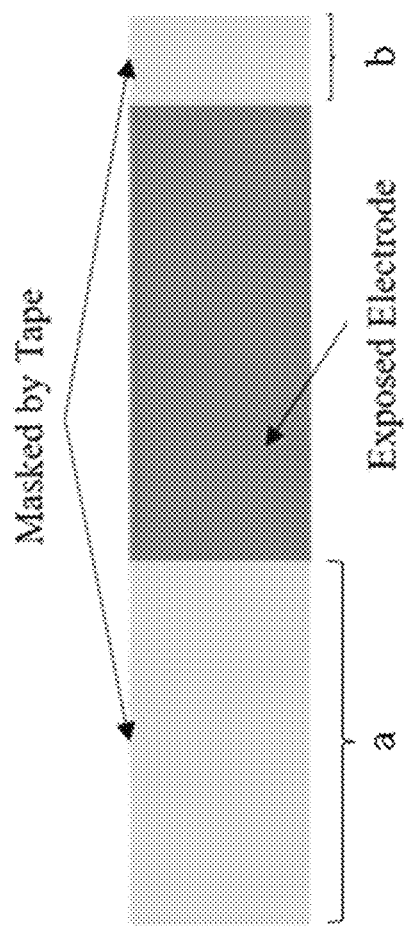
FIG. 2A and FIG. 2B are schematic views of an electrode masked according to the present invention.
Figure 2B:
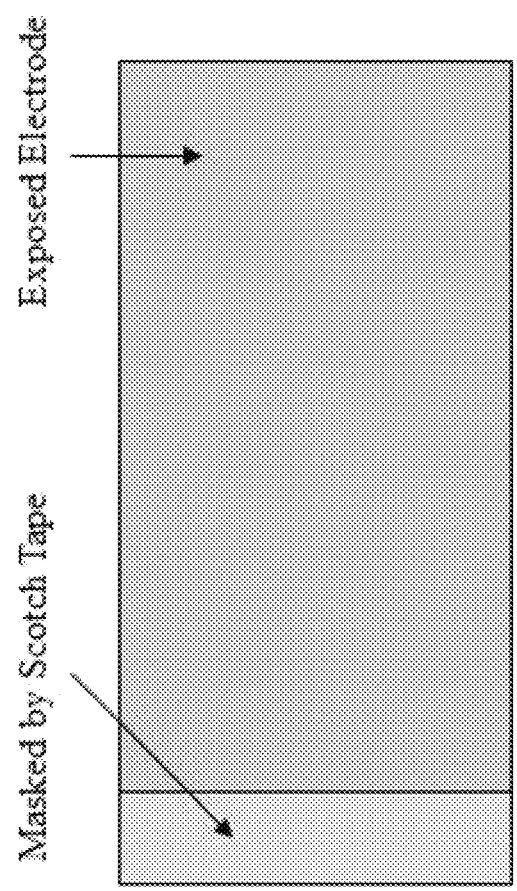

Meanwhile, the first electrode 100 and the second electrode 200 may be configured such that one end of each electrode protrudes from the triboelectric generation layer 300 in order to couple (ground) the wire (see FIG. 2A and FIG. 2B). In addition, in the present invention, the first electrode 100 and the second electrode 200 prevent a short phenomenon between both electrodes. Further, in order to identically maintain the area of the triboelectric generation layer 300 for each device, other remaining external exposed surface except for a part facing the triboelectric generation layer 300 may be masked by a tape coated with an adhesive component or an insulating material such as PP or PE. FIG. 2A and FIG. 2B are schematic views of an electrode masked according to the present invention, wherein the masking treatment of the electrode may be performed on both sides (a and b of FIG. 2A) as illustrated in FIG. 2A, may also be performed only on one side as illustrated in FIG. 2B, and may vary depending on the performance and the like of a target electrode. In addition, the content of basic roles of electrode not described above may comply with the content of electrode used in the conventional triboelectric device.

Figure 3:
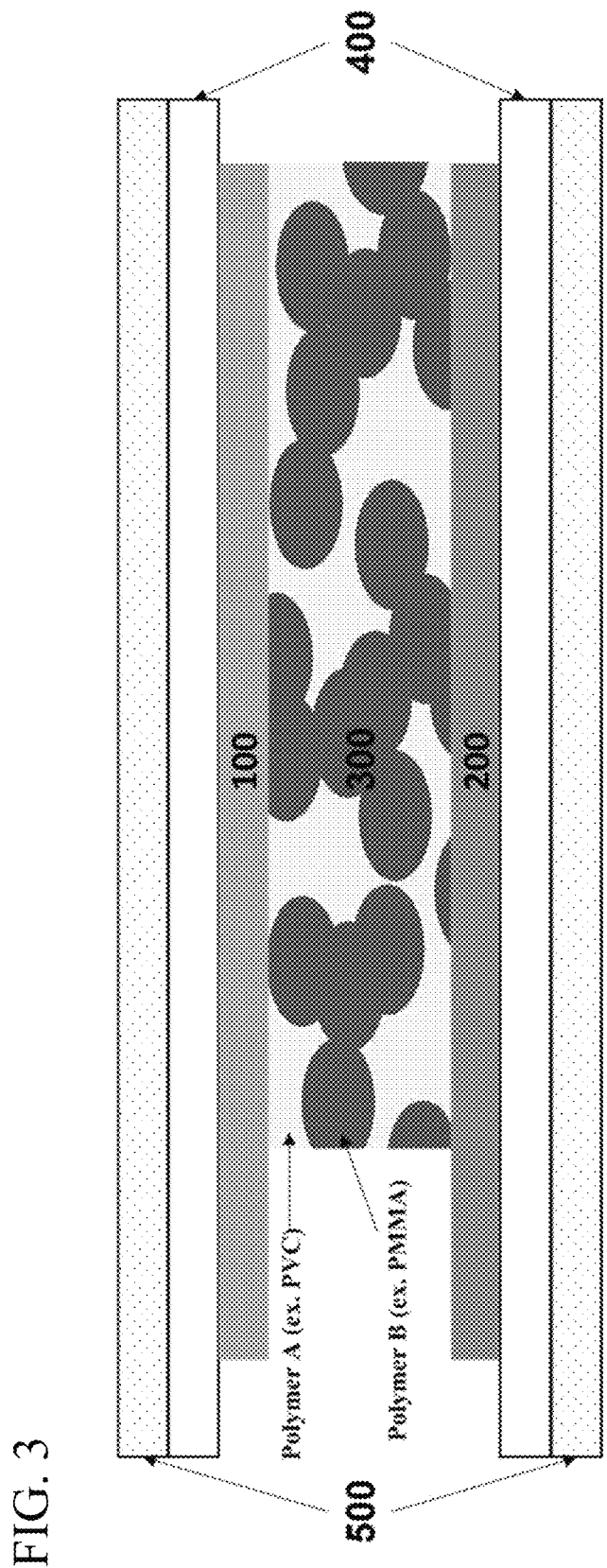
FIG. 3 is a side cross-sectional schematic view of a triboelectric power generating device according to another example of the present invention.

FIG. 3 is a side cross-sectional schematic view of a triboelectric power generating device according to another example of the present invention. On the other hand, the triboelectric power generating device, as illustrated in FIG. 3, may further include at least a pair of first coating layers 400 which are located on the outer peripheral surface of each of the first and second electrodes 100, 200 to prevent water, moisture, and oxygen, and the like, if necessary. In addition, the triboelectric generating device may further include at least a pair of second coating layers 500 which are located on the outer peripheral surface of each of the first coating layers 400 to be supported.

Specifically, the first coating layer 400 is a layer for improving water-proof, moisture-proof, oxygen blocking, weather resistance, durability, and the like of the triboelectric power generating device according to the present invention and blocking the inside of the device from the outside. Examples of the material thereof may include epoxy, polyester, polyurethane, a mixture of paraffin wax and polyolefin, polyethylene terephthalate (PET), polypropylene (PP), polyethylene (PE), polystyrene (PS), polyvinyl chloride (PVC), polyethylene naphthalate (PEN), polyamide (PA), polyvinyl alcohol (PVAL), ethylene vinyl alcohol (EVOH), polyvinylidene chloride (PVDC), and mixtures thereof, and may be used without particular limitation so long as the material has at least one property of water-proof, moisture-proof, oxygen blocking, weather resistance, and durability.

In addition, the second coating layer 500 basically has a function of supporting the triboelectric generating device, and may also have the function of the first coating layer 400, and more precisely, is a layer for applying elasticity to the device. Example of the material of the second coating layer 500 may include polyimide, polyether ether ketone, mixtures thereof, and mixtures of at least one thereof and compounds constituting the first coating layer 400, and any materials may be used without particular limitation so long as the material enables the triboelectric power generating device to have a supporting function such as flexibility and durableness.

The thickness of the first coating layer 400 is 100 nm to 10 mm, preferably 1 um to 1 mm, and more preferably 10 to 100 um. When the thickness of the first coating layer 400 is out of the above range, there may be a problem that the flexibility of the device is reduced or a function such as water-proof/moisture-proof is not sufficiently performed. Meanwhile, both ends of the first coating layer 400 may be configured to protrude from both ends of the first and second electrodes 100, 200 as illustrated in FIG. 3 in order to protect the entire device including the collector electrode from water, moisture, and oxygen.

In addition, the thickness of the second coating layer 500 is 1 um to 10 mm, preferably 5 um to 5 mm, and more preferably 10 um to 1 mm. When the thickness of the second coating layer 500 is out of the above range, there may be a problem that the flexibility of the device is reduced or the function of supporting the device is not be sufficiently performed. Meanwhile, in FIG. 3, the lengths of the first coating layer 400 and the second coating layer 500 are the same, but this is only an example, and any one end or both ends of the second coating layer 500 may also be configured to protrude from the first coating layer 400. With such a protruding configuration, the coating layer is completely coated (wrapped) once more by an outer support layer, thereby improving a blocking effect from the outside.

Figure 4:
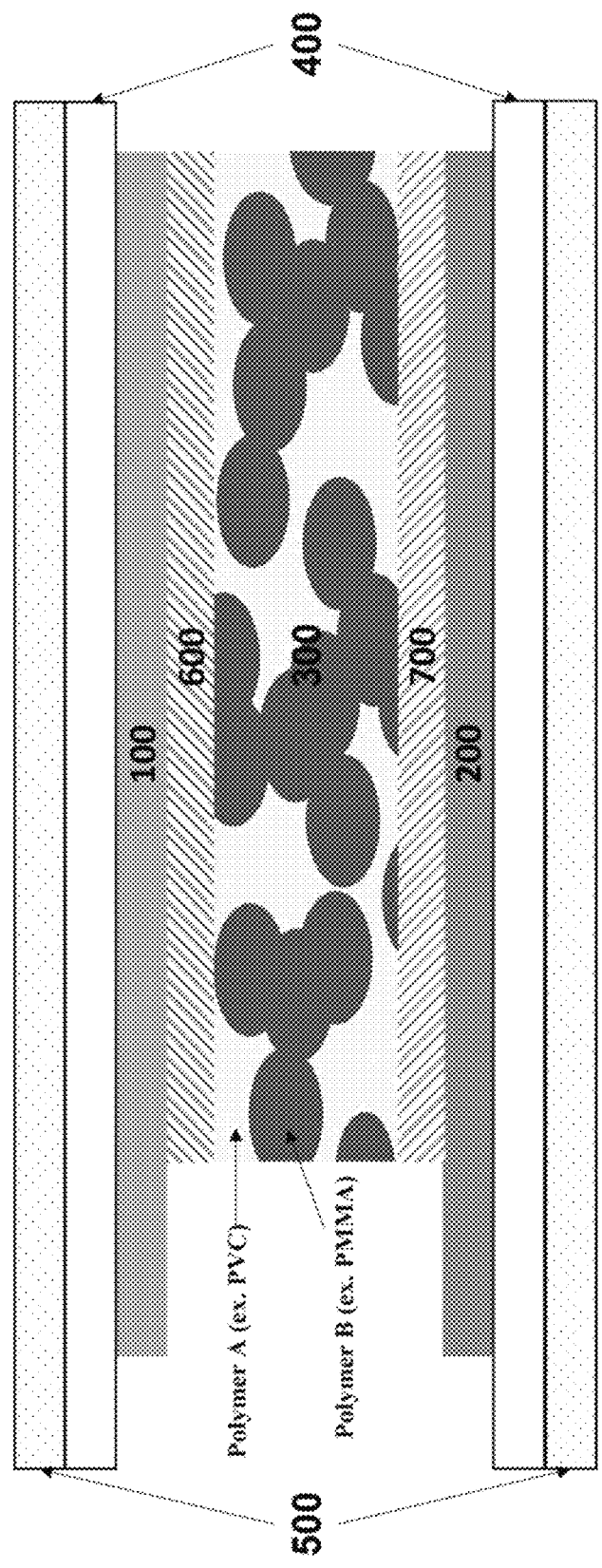
FIGS. 4 and 5 are side cross-sectional schematic views of a triboelectric power generating device according to yet another example of the present invention.
Figure 5:
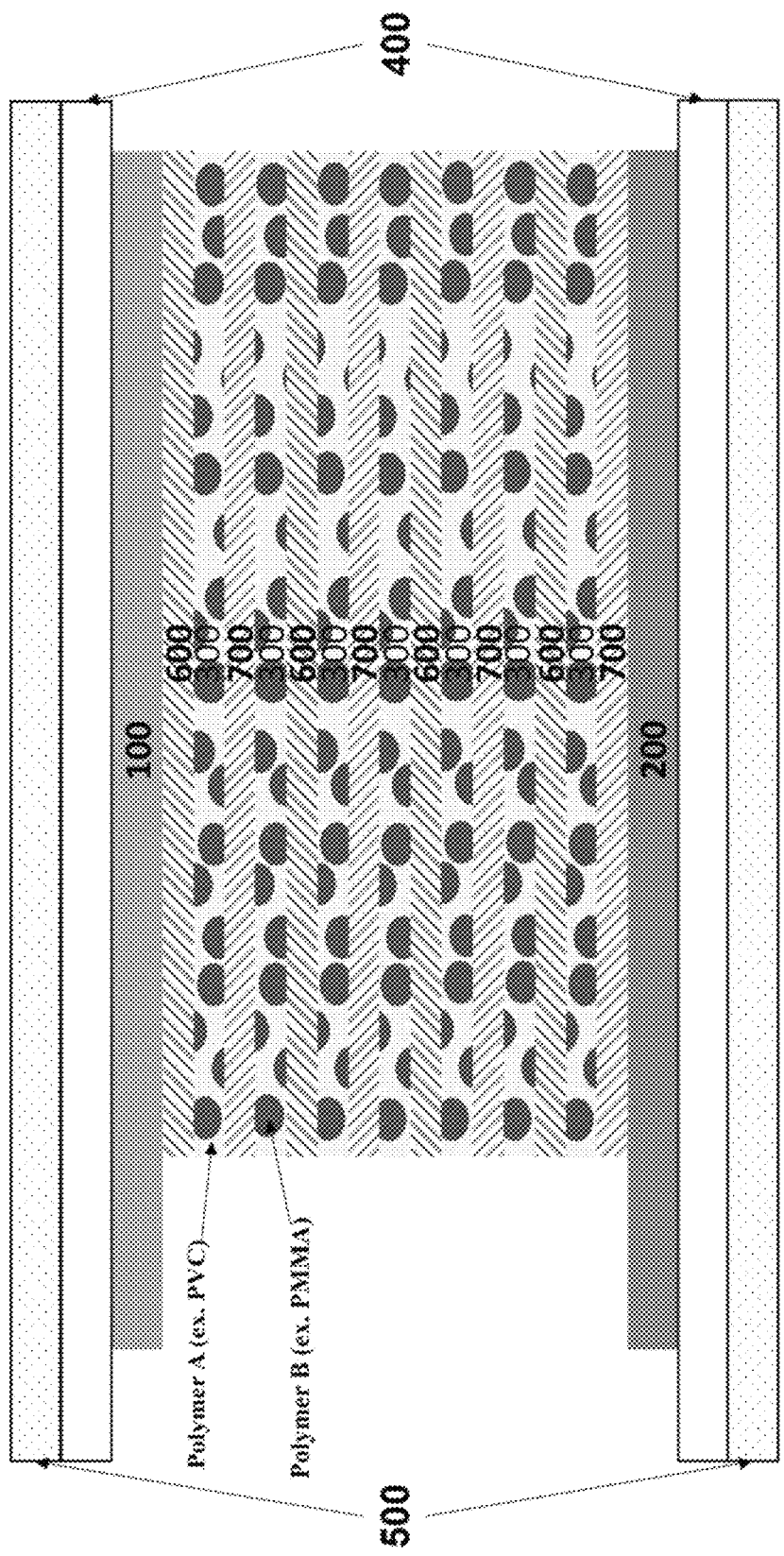

FIGS. 4 and 5 are side cross-sectional schematic views of a triboelectric power generating device according to yet another exemplary embodiment of the present invention. Meanwhile, the triboelectric power generating device according to the present invention, if necessary, as illustrated in FIG. 4, may further include a first interface layer 600 and a second interface layer 700, including a material selected from the group consisting of polyamide, polyvinyl alcohol (PVA), polymethylmethacrylate (PMMA), polyester, polyurethane, polyvinyl butyral (PVB), polyacrylonitrile, natural rubber, polystyrene (PS), polyvinylidene chloride, polyethylene (PE), polypropylene (PP), polyimide, polyvinylchloride (PVC), and polydimethylsiloxane (PDMS), between the triboelectric generation layer 300 and the first electrode 100, and between the triboelectric generation layer 300 and the second electrode 200, respectively. In addition, the triboelectric power generating device according to the present invention includes the first interface layer 600 and the second interface layer 700 formed of a plurality of layers which may be cross-laminated with the triboelectric generation layer 300 as necessary to improve the performance of the device as illustrated in FIG. 5, and the order thereof is not limited to FIG. 5, and may be formed in various combinations in consideration of device performance.

The first interface layer 600 and the second interface layer 700 are to further improve an interaction with the triboelectric generation layer 300 and a generation degree of electricity by preventing charges from flowing reversely from the triboelectric generation layer 300. The first interface layer 600 and the second interface layer 700 have different triboelectric polarities, and for example, when the first interface layer 600 is PMMA, the second interface layer 700 may be PVC. Specifically, when any one of the first interface layer 600 and the second interface layer 700 is selected from the group consisting of PMMA, polyamide, polyvinyl alcohol, polybutyral, and polystyrene, the other interface layer may be selected from the group consisting of PVC, PDMS, polypropylene, polyethylene, and polyvinylidine chloride.

In addition, the thickness of the first interface layer 600 and the second interface layer 700 is 1 nm to 1 mm, preferably 50 nm to 500 um, and more preferably 100 nm to 100 um. When the thicknesses of the first interface layer 600 and the second interface layer 700 are out of the above range, there may be a problem that the flexibility of the device is reduced, the generation performance of the device is lowered, or a function of blocking charges that move reversely from the triboelectric generation layer 300 is not properly performed.

Meanwhile, the widths (width×length, based on an appearance viewed from the top) of the triboelectric generation layer 300, the first electrode 100, the second electrode 200, the first coating layer 400, the second coating layer 500, the first interface layer 600, and the second interface layer 700 described so far are not particularly limited, and may vary depending on the size and characteristics of a target triboelectric power generating device.

Next, a manufacturing method of a triboelectric power generating device according to the present invention will be described with reference to FIGS. 1 and 3. The manufacturing method of the triboelectric power generating device includes the steps of a) dissolving and dispersing, or dissolving and dispersing and then mixing, or melting and mixing two or more polymers having different dielectric properties in a solvent, respectively; b) masking a part of the surface of each of a first electrode and a second electrode having different materials; c) supplying a polymer solution which is mixed or unmixed in step a) onto the unmasked exposed surface of any one of the masked first and second electrodes (the second electrode 200 in the drawing), and then drying or curing the polymer solution to form a triboelectric generation layer (or a polymer composite film) 300 on the electrode; and d) laminating and then pressing the other electrode (the first electrode 100 in the drawing), on which the triboelectric generation layer 300 is not formed, on the top of the triboelectric generation layer 300.

Meanwhile, after at least one of steps c) and d) is performed, a process of annealing the triboelectric generation layer 300 may be performed, and the manufacturing method of the triboelectric power generating device further includes the steps of e) forming a first coating layer 400 on the outer peripheral surface of each of the first electrode 100 and the second electrode 200, and f) forming a second coating layer 500 on the outer peripheral surface of each of the first coating layers 400, if necessary.

According to the present invention, in order to manufacture the triboelectric power generating device, first, it needs to dissolve and disperse, dissolve, disperse, and then mix, or melt and mix two or more polymers having different dielectric properties in an solvent, respectively (in the case of emulsion polymerization, mixing a water-borne solution and a solvent-borne solution, step a). The polymer (material) constitutes a friction portion for generating electricity in the triboelectric power generating device, and the detailed description thereof complies with the contents of the polymers described in the triboelectric power generating device. On the other hand, when the polymer is not mixed after being dissolved and dispersed in each solvent, a laminated-type triboelectric power generating device may be manufactured by sequentially supplying each polymer solution on an electrode.

Dissolving/dispersing the polymer in the solvent is a unique process of the present invention for further improving the mass-productivity of the polymer. Examples of the solvent that can be used may include organic solvents, such as linear and cyclic alkane-based compounds, aromatic-based compounds, ketone-based compounds, linear and cyclic ether-based compounds, amine-based compounds, sulfide-based compounds, and halogen-based compounds. More specifically, examples of general solvents may include hexane, cyclohexane, toluene, acetone, diethyl ether, tetrahydrofuran (THF), N-methyl-2-pyrrolidone, dimethyl sulfoxide, dichloromethane, and chloroform.

The concentration at which the polymer is dissolved in the solvent is 0.1 to 10,000 g/kg, preferably 1 to 5,000 g/kg, and more preferably 10 to 1,000 g/kg. When the concentration at which the polymer is dissolved in the solvent is out of the above range, an effect obtained by dissolving the polymer in the solvent may be insignificant or the mixing process may be difficult. In addition, the temperature at which the polymer is dissolved in the solvent is 0° C. to 70° C., preferably 10° C. to 50° C., and more preferably 25° C. to 40° C. When the temperature at which the polymer is dissolved in the solvent is out of the above range, there may be a problem that the polymer is insoluble or decomposed, or increases the risk of explosion.

At this time, a mixing ratio of each polymer solution may be a weight ratio of 0.1:99.9 to 99.9:0.1, preferably a weight ratio of 20:80 to 80:20, and more preferably a weight ratio of 40:60 to 60:40. Meanwhile, when performing step a) of mixing the different polymer solutions, in order to reinforce the flexibility and impact strength of each polymer material, additives such as plasticizers and impact modifiers may be additionally added, if necessary.

Next, after preparing the electrodes (the first electrode and the second electrode) having different materials, a part of each surface is masked (step b). The first electrode and the second electrode should be made of different materials to enable the generation of triboelectricity. The reason for masking a part of the surface of the first and second electrodes with a tape is to prevent a short phenomenon between both electrodes and to keep an area of the triboelectric generation layer the same for each device, so that a part to which the polymer mixed solution is not to be applied (or supplied) is defined as a masking application portion. In addition, the detailed description of the electrodes and the masking complies with the contents of the electrodes and masking described in the triboelectric power generating device.

After the surface of each electrode is masked, by supplying a polymer solution which is mixed or unmixed in step a) on a unmasked exposed surface in any one of the first and second electrodes (the second electrode 200 in the drawing), and then drying or curing the polymer solution to form a triboelectric generation layer (or a polymer composite film 300) on an electrode (step c). As the method of supplying the polymer mixed solution on the electrode, there are drop casting, screen printing, spin coating, rotogravure printing, spray coating, inkjet printing, and the like. In addition, the triboelectric generation layer 300 has a thickness of 1 nm to 10,000 μm, preferably 100 nm to 5,000 μm, and more preferably 1 to 1,000 μm. When the thickness of the triboelectric generation layer 300 exceeds 10,000 μm, an electric field generated by the separation of charges generated at a junction portion does not affect a collector electrode, which may cause a problem that voltage and current cannot be generated. When the thickness thereof is less than 1 nm, a distance between the collector electrodes is too close, which may cause a short phenomenon in devices due to a tunneling phenomeon.

Meanwhile, the manufacturing method of the triboelectric power generating device further includes the step of re-supplying the polymer mixed solution used in step c) one or more times, preferably 1 to 100 times, and more preferably 5 to 20 times onto the surface of the polymer composite film (the triboelectric generation layer) formed in step c) and then drying the solution, if necessary. As this is a process for adjusting the thickness of the polymer composite film, as the concentration of the polymer in step a) is lowered, the number of re-supplying times may be increased. Therefore, when the concentration of the polymer is high, the re-supplying process of such a polymer mixed solution may not be performed.

In addition, it is described in the present specification that the polymer solution and the mixed solution are first prepared, and then the surface of the electrode is masked, but this is only for convenience of description and the order thereof may be changed or proceed simultaneously.

When the triboelectric generation layer is formed on the electrode as described above, the other electrode (the first electrode 100 in the drawing) in which the triboelectric generation layer 300 is not formed is laminated and then pressed on the annealed triboelectric generation layer 300. The pressing may be performed under a temperature of 40° C. to 250° C. and a pressure of 1 gF to 100 kgF by a general pressing method such as a roll-press method and a hot-press method.

On the other hand, after at least one of steps c) and d) is performed, a process of annealing the triboelectric generation layer 300 is performed. The annealing process is a process in which the triboelectric generation layer 300 is made at a predetermined temperature, maintained at the corresponding temperature for a predetermined time, and then cooled to room temperature, and is used for optimizing the power generation efficiency according to the control of the total junction area by controlling the aggregation degree of polymers in the triboelectric generation layer 300. The temperature, the required time, and the number of times of the annealing process may be arbitrarily changed in consideration of physical properties of the target power generating device, but the annealing process may be performed 1 to 24 times, preferably 1 to 10 times at a temperature of 30° C. to 250° C., preferably 50° C. to 150° C. for 1 to 3,600 seconds, preferably 10 to 180 seconds.

Meanwhile, when the annealing process is performed, as illustrated in FIG. 4, the interface layers (the first interface layer 600 and the second interface layer 700 in FIG. 4) may be formed between the triboelectric generation layer 300 and the first electrode 100, and between the triboelectric generation layer 300 and the second electrode 200 (alternatively, on both sides of the triboelectric generation layer 300), respectively. This is a phenomenon in which the polymer of the triboelectric generation layer 300 leaks up and down by heating during the annealing process, and is caused by a difference in density. The first interface layer 600 and the second interface layer 700 may be induced to be formed with polymers having opposite triboelectric polarities to each other.

Meanwhile, in addition to the method formed by the annealing process, the interface layer may be intentionally formed at a time before forming the triboelectric generation layer (or the polymer composite film) 300 on the electrode. Accordingly, as illustrated in FIG. 5, the first interface layer 600 and the second interface layer 700 may be formed of a plurality of layers to be cross-laminated with the triboelectric generation layer 300, and the order thereof is not limited to FIG. 5 and may be formed in various combinations in consideration of device performance. Here, when the triboelectric device is configured as illustrated in FIG. 5, the performance of the device may be further improved.

Meanwhile, after forming the first coating layer 400 in step e) or even after forming the second coating layer 500 in step f), the annealing process may be further performed, if necessary. In addition, the description of the material, the thickness, and the like of the first coating layer 400 and the second coating layer 500 complies with the contents described in the triboelectric power generating device.

Hereinafter, the present invention will be described in more detail with reference to specific examples. The following examples are illustrative of the present invention and the present invention is not limited to the following examples.

[Example 1] Preparation of Triboelectric Power Generating Device

First, PMMA was dissolved in tetrahydrofuran (THF) at room temperature at a concentration of 0.1 g/mL, and PVC was also dissolved in THF at room temperature at the same concentration of 0.1 g/mL, and then the PMMA solution and the PVC solution were mixed at a weight ratio of 1:1 to prepare a polymer mixed solution.

Next, after bonding an aluminum electrode having a size of 4.3 cm×9 cm×10 μm on the surface of a PET coated paper coated with an acrylic adhesive and washing the surface of the electrode with acetone, in the form as illustrated in FIG. 2, two electrode films were prepared, in which the remaining portion except for an area (exposed electrode) of 4.3 cm×8 cm was masked by a Scotch tape.

Subsequently, on the surface of one exposed (unmasked) electrode film, a PMMA-PVC polymer mixed solution was bar-coated and dried to form a triboelectric generation layer, and then the PMMA-PVC polymer mixed solution was additionally bar-coated 5 times on the upper side (surface) of the triboelectric generation layer and dried.

Thereafter, one masked electrode film was laminated on the electrode surface coated with the PMMA-PVC polymer mixed solution, and then a triboelectric generation layer was annealed at 70° C. to 90° C. for about 5 seconds by using a laminator (Kolami-320S, Kolami, in Korea) and pressed at a pressure of about 1 kgF to prepare a triboelectric power generating device.

[Example 2] Preparation of Laminated-Type Triboelectric Power Generating Device

A triboelectric power generating device was prepared in the same manner as in Example 1, except that the PVC and PMMA layers were sequentially coated one time and laminated without mixing the PVC and PMMA solutions.

[Example 3] Preparation of Laminated-Type Triboelectric Power Generating Device

A triboelectric power generating device was prepared in the same manner as in Example 2, except that the PVC and PMMA layers were alternately coated 3 times and laminated.

[Example 4] Preparation of Laminated-Type Triboelectric Power Generating Device

A triboelectric power generating device was prepared in the same manner as in Example 2, except that the PVC and PMMA layers were alternately coated 5 times and laminated.

[Comparative Example 1] Preparation of Triboelectric Power Generating Device

A triboelectric power generating device was prepared in the same manner as in Example 1, except that drop casting, drying, and annealing processes were excluded by not using the polymer mixed solution.

[Comparative Example 2] Preparation of Triboelectric Power Generating Device

A triboelectric power generating device was prepared in the same manner as in Example 1, except that a PMMA polymer solution was used by excluding a PVC solution instead of a PMMA-PVC polymer mixed solution (that is, the triboelectric generation layer was configured by only a PMMA polymer).

[Comparative Example 3] Preparation of Triboelectric Power Generating Device

A triboelectric power generating device was prepared in the same manner as in Example 1, except that a PVC polymer solution is used by excluding the PMMA solution instead of a PMMA-PVC polymer mixed solution (that is, the triboelectric generation layer was configured by only a PVC polymer)

[Example 1 and Comparative Examples 1 to 3] Evaluation of Triboelectric Generation Amounts After a multimeter (UT61E, UNI-T Co., Ltd., China) was connected with both electrodes of the triboelectric power generating devices prepared in Example 1 and Comparative Examples 1 to 3 with wires, changes in voltage depending on an impact applied to the devices were measured. That is, the device was bent up and down three times per second (3 Hz) for 20 seconds after a first pause of 10 seconds, and subsequently, after a pause of 10 to 20 seconds, the remaining process except for the first pause was additionally repeated 2 times.

Figure 6:
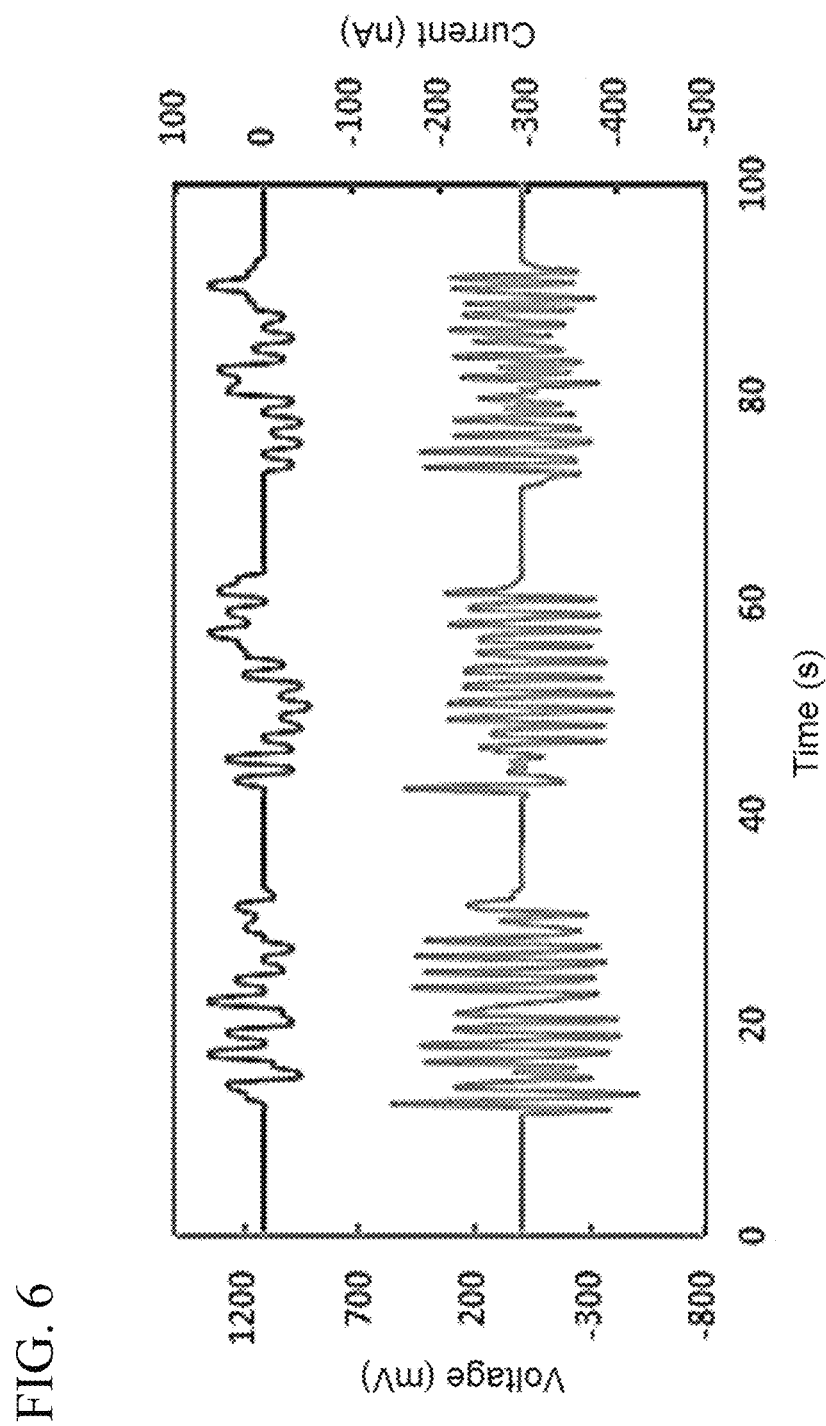
FIG. 6 is a graph of measuring a voltage and a current according to an impact applied to a triboelectric power generating device according to an example of the present invention.
Figure 7:
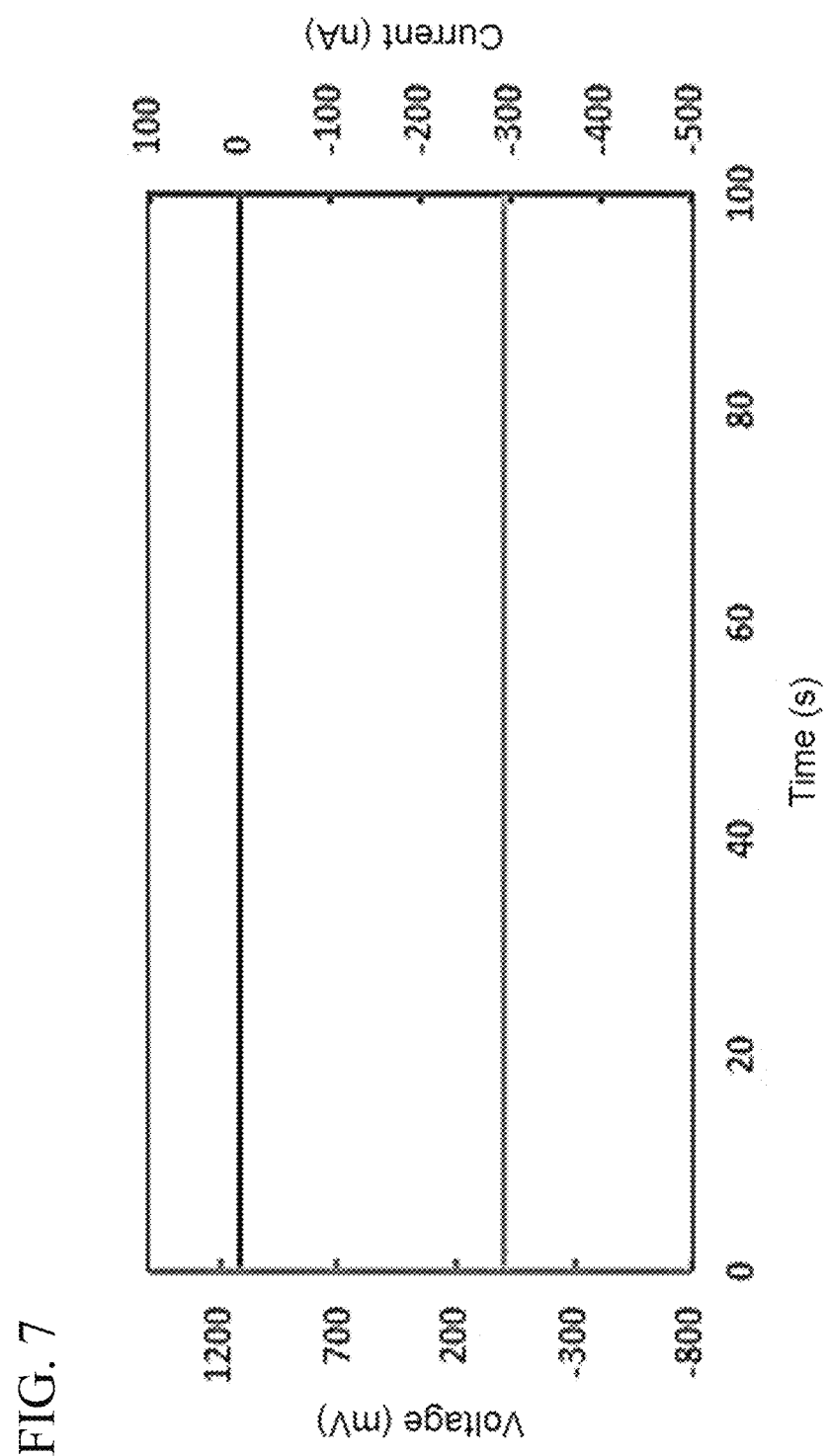
FIGS. 7 to 9 are graphs of measuring a voltage and a current according to an impact applied to a triboelectric power generating device according to the comparative examples of the present invention.
Figure 8:
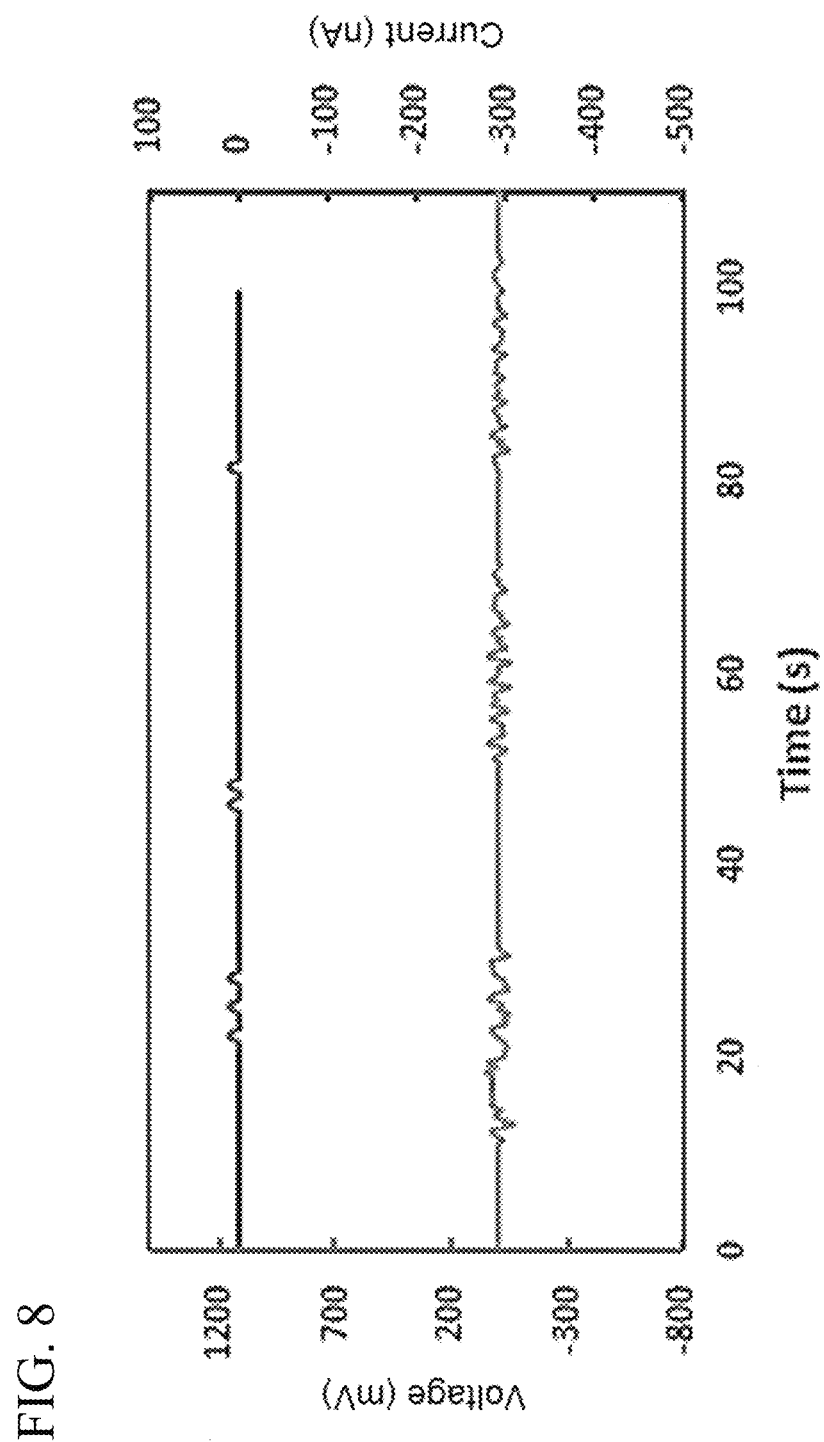
Figure 9:
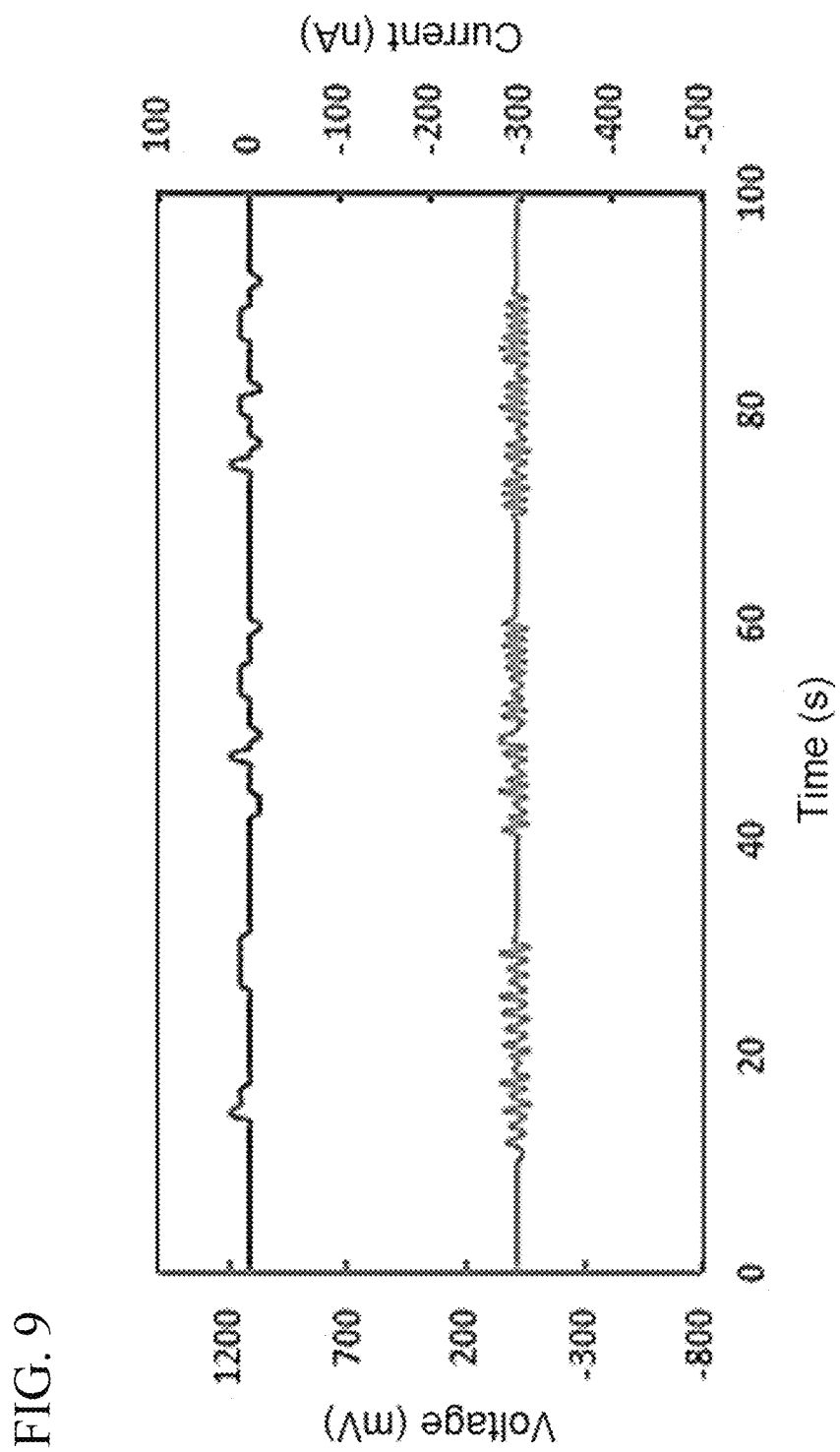

FIG. 6 is a graph of measuring a voltage and a current according to an impact applied to a triboelectric power generating device according to an example of the present invention and FIGS. 7 to 9 are graphs of measuring a voltage and a current according to an impact applied to a triboelectric power generating device according to the comparative examples of the present invention. Here, FIG. 6 corresponds to Example 1 and FIGS. 7 to 9 correspond to Comparative Examples 1 to 3, respectively. First, in the case of the triboelectric power generating device prepared in Example 1 (using the polymer composite film), as illustrated in FIG. 6, it could be confirmed that electricity was immediately generated depending on an impact/change applied to the device.

On the other hand, in the case of the device prepared in Comparative Example 1 (without using the polymer composite film), as illustrated in FIG. 7, it can be seen that triboelectricity was not generated at all. In the case of the device prepared in Comparative Example 2 (using only the PMMA polymer), as illustrated in FIG. 8, it can be confirmed that electricity was generated, but it is significantly less than Example 1. In the case of the device prepared in Comparative Example 3 (using only the PVC polymer), as illustrated in FIG. 9, it can be confirmed that only a very small amount of electricity is generated.

[Examples 2 to 4] Evaluation of Triboelectric Generation Amounts

After a multimeter (UT61E, UNI-T Co., Ltd., China) was connected with both electrodes of the laminated-type triboelectric power generating devices prepared in Examples 2 to 4 with wires, voltage changes depending on an impact applied to the devices are measured. That is, the device was bent up and down three times per second for 20 seconds after a first pause of 10 seconds, and subsequently, after a pause of 10 to 20 seconds, the remaining process except for the first pause is additionally repeated 2 times.

Figure 10:
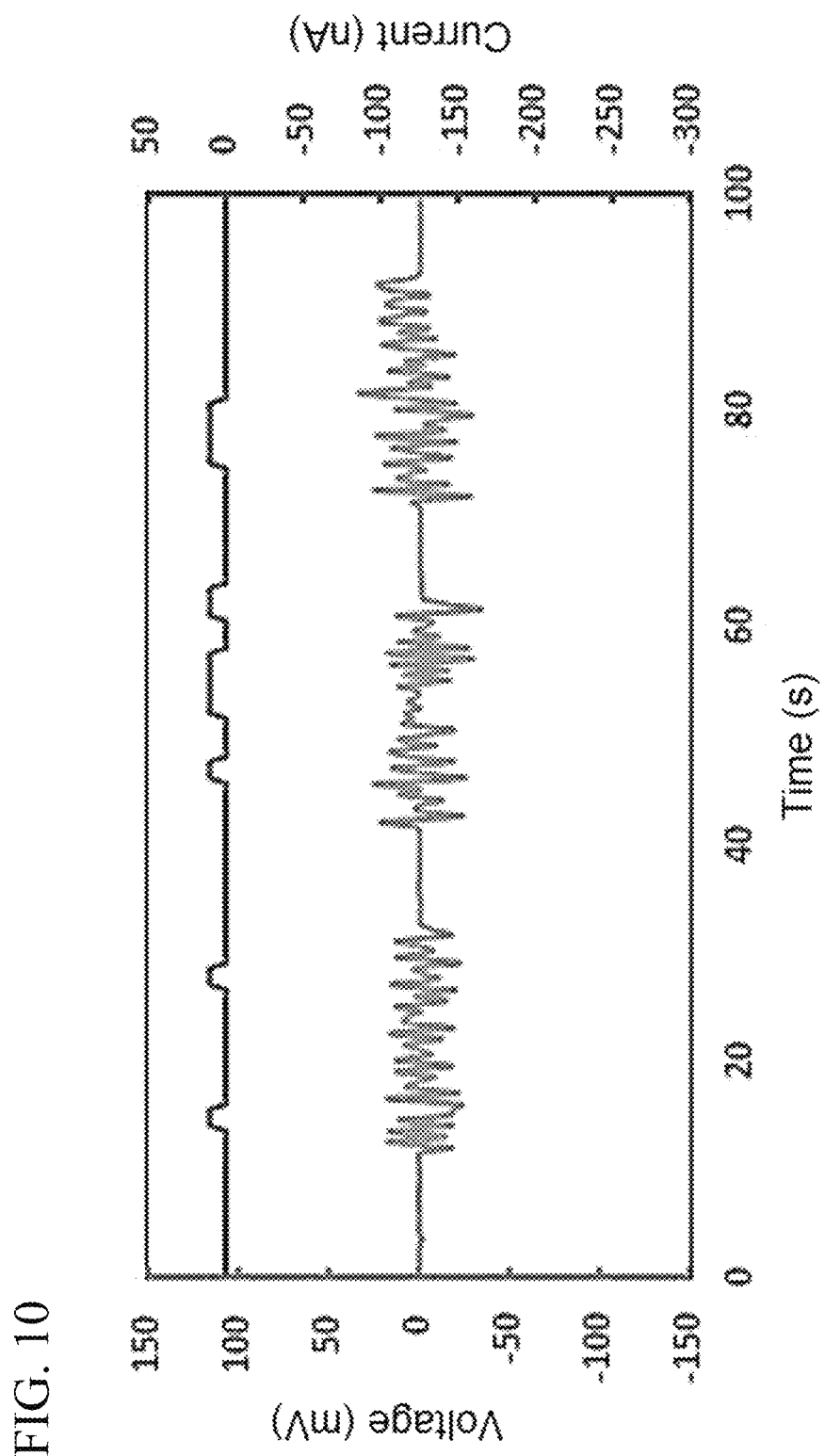
FIGS. 10 to 12 are graphs of measuring a voltage and a current according to an impact applied to a triboelectric power generating device according to other examples of the present invention.
Figure 11:
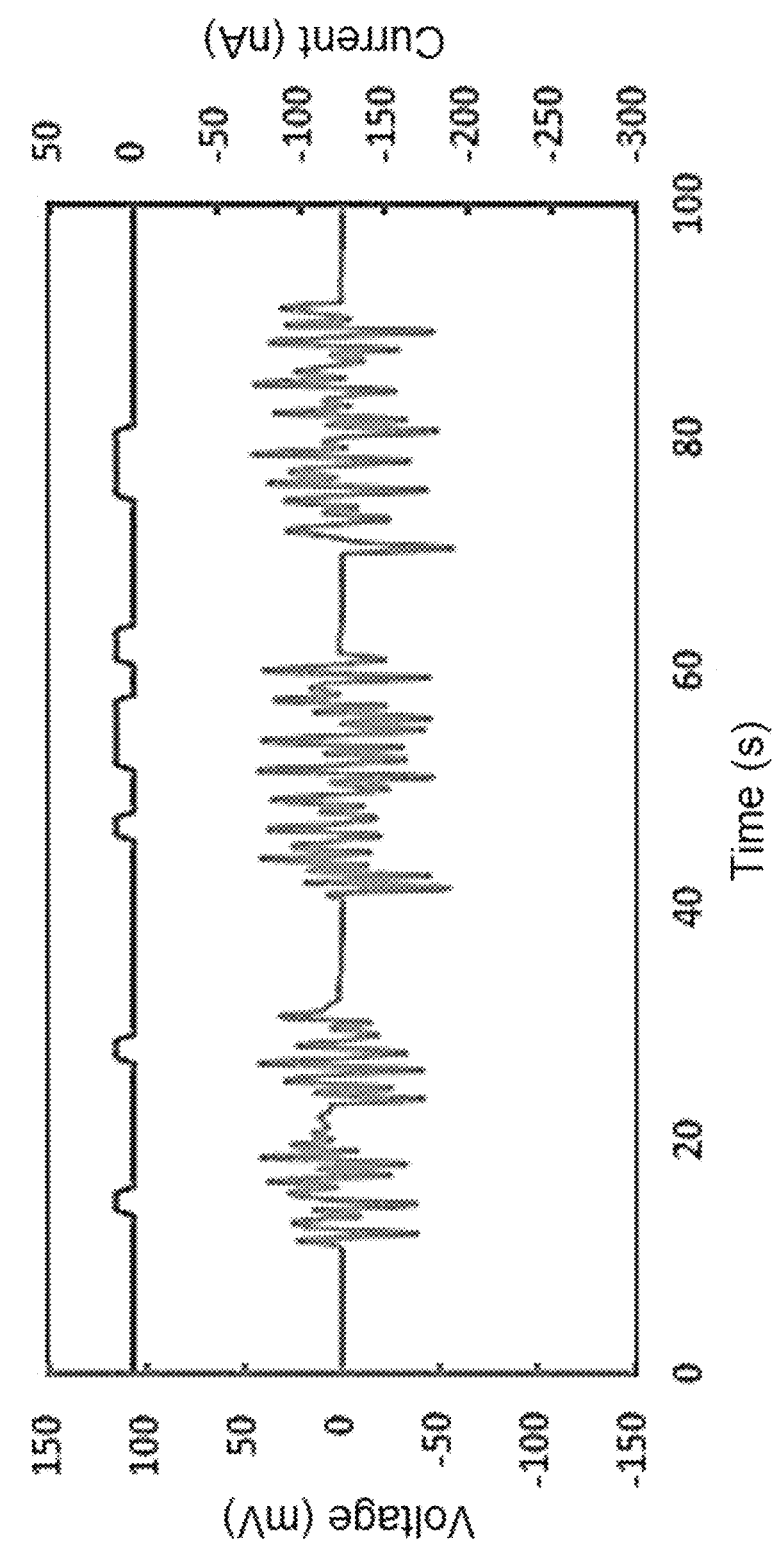
Figure 12:
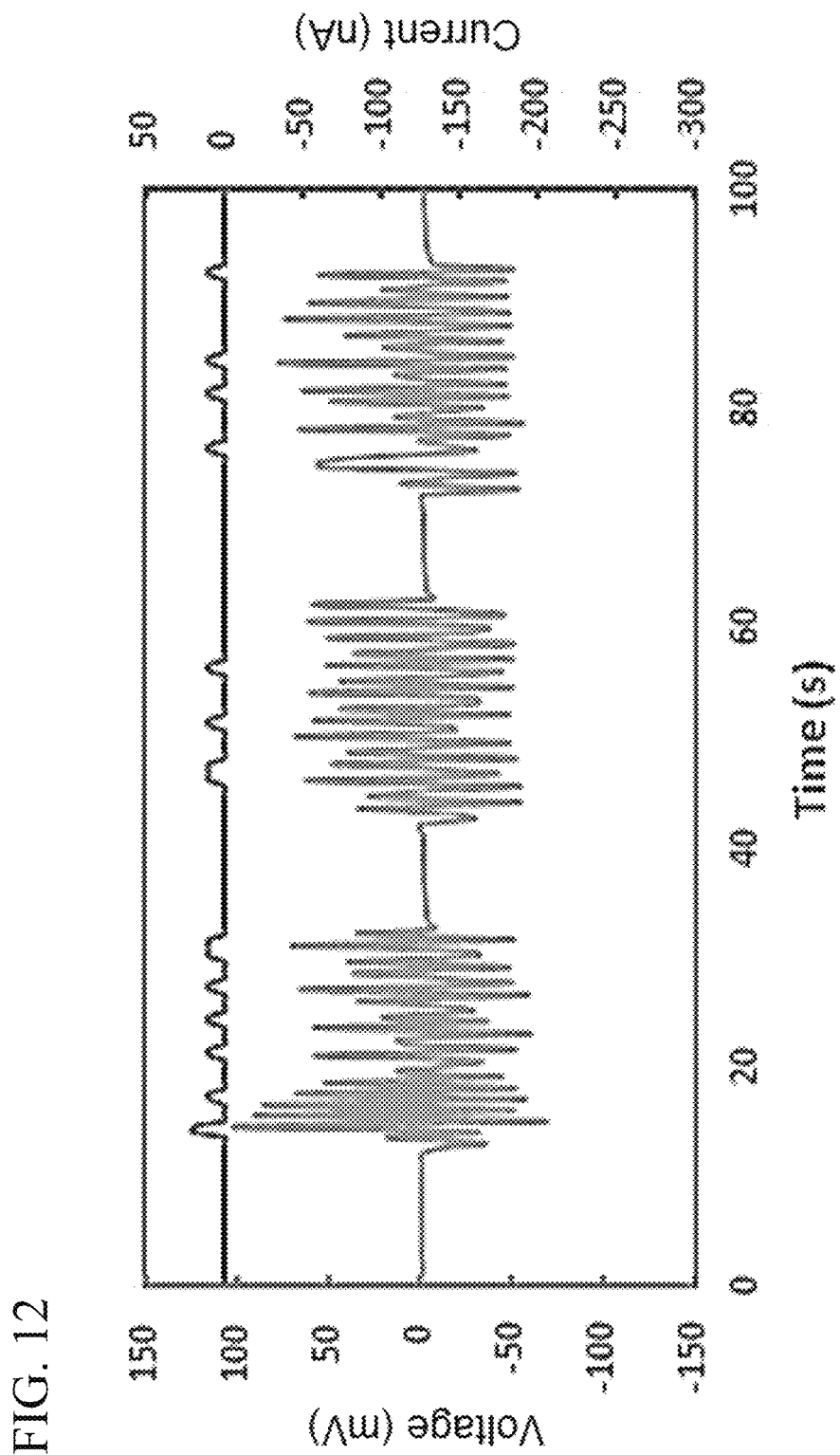

FIGS. 10 to 12 are graphs of measuring a voltage and a current according to an impact applied to a triboelectric power generating device according to other examples of the present invention, and FIGS. 10 to 12 correspond to Examples 2 to 4, respectively. In the laminated-type triboelectric power generating devices prepared in Examples 2 to 4, as in Example 1 for the triboelectric power generating device which is not a laminated type, it can be confirmed that the electricity is immediately generated depending on an impact/change applied to the device (see FIGS. 10 to 12). In addition, it can be confirmed that as the number of laminated layers increases, the voltage and overall current amount of electricity generated increases.

The invention claimed is:

1. A triboelectric power generating device comprising:
   a triboelectric generation layer including a friction portion having a junction structure, said triboelectric generation layer being made of two or more different polymers;
   a first electrode which is located to face one surface of the triboelectric generation layer; and
   a second electrode which is located to face the other surface of the triboelectric generation layer,
   wherein the friction portion is formed of junction portions in a scale of nanometer to micrometer, and
   wherein the junction portions have a bulk-heterojunction structure in which the two or more different polymers are not uniformly contacted, or have a multi junction structure.

2. The triboelectric power generating device of claim 1, wherein the two or more different polymers are selected from the group consisting of polyamide, polyvinyl alcohol, polymethylmethacrylate, polyester, polyurethane, polyvinyl butyral, polyacrylonitrile, natural rubber, polystyrene, polyvinylidene chloride, polyethylene, polypropylene, polyimide, polyvinylchloride, and polydimethylsiloxane, respectively.

3. The triboelectric power generating device of claim 1, wherein the two or more different polymers are included in the triboelectric generation layer at a weight ratio of 0.1:99.9 to 99.9:0.1.

4. The triboelectric power generating device of claim 1, wherein the first and second electrodes are independently selected from the group consisting of copper, aluminum, gold, silver, carbon felt, carbon paper, and a composite added with carbon nanotubes (CNT).

5. The triboelectric power generating device of claim 1, wherein in the first and second electrodes, an external exposed surface remaining except for a part facing the triboelectric generation layer is masked by a tape coated with an adhesive component or an insulating material.

6. The triboelectric power generating device of claim 1, further comprising:
   at least on one pair of first coating layers which are located on outer peripheral surface of each of the first and second electrodes; and
   at least one pair of second coating layers which are located on outer peripheral surface of each of the at least one pair of first coating layers.

7. The triboelectric power generating device of claim 6, wherein the at least one pair of first coating layers are independently selected from the group consisting of epoxy, polyester, polyurethane, a mixture of paraffin wax and polyolefin, polyethylene terephthalate, polypropylene, polyethylene, polystyrene, polyvinyl chloride, polyethylene naphthalate, polyamide, polyvinyl alcohol, ethylene vinyl alcohol, polyvinylidene chloride, and mixtures thereof.

8. The triboelectric power generating device of claim 6, wherein the at least one pair of second coating layers are independently selected from the group consisting of polyimide, polyether ether ketone, mixtures thereof, and mixtures of at least one thereof and a compound constituting the at least one pair of first coating layers.

9. The triboelectric power generating device of claim 6, wherein each first coating layer of the at least one pair of first coating layers has a thickness of 100 nm to 10 mm and each second coating layer of the at least one pair of second coating layers has a thickness of 1 um to 10 mm.

10. The triboelectric power generating device of claim 1, wherein the triboelectric generation layer has a thickness of 1 nm to 10,000 μm.

11. The triboelectric power generating device of claim 1, wherein the first and second electrodes have a thickness of 20 nm to 5 mm.

12. The triboelectric power generating device of claim 1, further comprising:
   a first interface layer and a second interface layer, which include materials selected from the group consisting of polyamide, polyvinyl alcohol, polymethylmethacrylate, polyester, polyurethane, polyvinyl butyral, polyacrylonitrile, natural rubber, polystyrene, polyvinylidene chloride, polyethylene, polypropylene, polyimide, polyvinylchloride, and polydimethylsiloxane between the triboelectric generation layer and the first electrode, and between the triboelectric generation layer and the second electrode, respectively,
   wherein the first interface layer and the second interface layer have different triboelectric polarities.

* * * * *